United States Patent
Nalla et al.

(10) Patent No.: US 10,051,723 B2
(45) Date of Patent: Aug. 14, 2018

(54) HIGH THERMAL CONDUCTIVITY REGION FOR OPTOELECTRONIC DEVICES

(71) Applicant: Microsoft Technology Licensing, LLC, Redmond, WA (US)

(72) Inventors: Ravi Kiran Nalla, San Jose, CA (US); Raymond Kirk Price, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/224,406

(22) Filed: Jul. 29, 2016

(65) Prior Publication Data

US 2018/0035531 A1      Feb. 1, 2018

(51) Int. Cl.
| | |
|---|---|
| *G02B 6/12* | (2006.01) |
| *H05K 1/02* | (2006.01) |
| *H05K 1/18* | (2006.01) |
| *H05K 3/32* | (2006.01) |
| *H05K 3/46* | (2006.01) |
| *G02B 6/42* | (2006.01) |

(52) U.S. Cl.
CPC ........... *H05K 1/0206* (2013.01); *G02B 6/428* (2013.01); *G02B 6/4267* (2013.01); *G02B 6/4283* (2013.01); *H05K 1/183* (2013.01); *H05K 3/32* (2013.01); *H05K 3/4697* (2013.01); *H05K 2201/10121* (2013.01)

(58) Field of Classification Search
CPC ........ H05K 1/0206; H05K 1/183; H05K 3/32; H05K 3/4697; H05K 2201/10121; G02B 6/4267; G02B 6/428; G02B 6/4283
USPC .......................................................... 385/14
See application file for complete search history.

(56) References Cited

U.S. PATENT DOCUMENTS

| | | |
|---|---|---|
| 8,100,567 B2 | 1/2012 | Erchak et al. |
| 8,958,448 B2 | 2/2015 | Canumalla et al. |
| 9,127,816 B2 | 9/2015 | Kuenzler et al. |
| (Continued) | | |

FOREIGN PATENT DOCUMENTS

| | | |
|---|---|---|
| CN | 102202459 | 9/2011 |
| CN | 102237481 | 11/2011 |
| (Continued) | | |

OTHER PUBLICATIONS

Ding,"Thermal and optical investigations of high power LEDs with metal", In Proceedings of International Communications in Heat and Mass Transfer 66, May 2015, 9 pages.

(Continued)

*Primary Examiner* — Jerry Blevins

(57) ABSTRACT

This document describes techniques and apparatuses that implement a high thermal conductivity region for optoelectronic devices. In some embodiments, a printed circuit board (PCB) includes a high thermal conductivity region that extends through the PCB. The high thermal conductivity region has first and second surfaces that are approximately coplanar with exterior layers of the PCB. A side-emitting optoelectronic device is mounted to the first surface of the high thermal conductivity region via conductive material that enables conduction of the device's heat into the high thermal conductivity region. The high thermal conductivity region can then transfer the heat away from the device and toward the second surface of the high thermal conductivity region, thereby improving the device's thermal performance.

17 Claims, 8 Drawing Sheets

(56) References Cited

U.S. PATENT DOCUMENTS

| | | |
|---|---|---|
| 2007/0267642 A1 | 11/2007 | Erchak et al. |
| 2011/0176280 A1* | 7/2011 | Lee .................. H01L 25/16 |
| | | 361/721 |
| 2014/0160745 A1 | 6/2014 | Mandelboum et al. |
| 2014/0229912 A1 | 8/2014 | Masalkar et al. |
| 2015/0069113 A1 | 3/2015 | Wang et al. |
| 2015/0380897 A1* | 12/2015 | Canumalla ............. G01B 11/22 |
| | | 348/135 |

FOREIGN PATENT DOCUMENTS

| | | |
|---|---|---|
| CN | 103633553 | 3/2014 |
| DE | 102014013375 A1 | 3/2016 |
| EP | 2792720 | 10/2014 |
| KR | 100990331 | 10/2010 |
| WO | WO-2015104715 | 7/2015 |
| WO | 2015149097 A1 | 10/2015 |

OTHER PUBLICATIONS

Langer,"Advanced Thermal Management Solutions on PCBs for High Power Applications", In Journal of IPC Apex Expo, Mar. 25, 2014, 15 pages.

Robert,"Thermal Analysis of PCB Mounted Small Outline Packages", Available at: http://www.eetimes.com/author.asp?section_id=36&doc_id=1328282, Nov. 22, 2015, 3 pages.

"International Search Report and Written Opinion Issued in PCT Application No. PCT/US2017/042984", dated Oct. 23, 2017, 12 Pages.

* cited by examiner

HIGH THERMAL CONDUCTIVITY REGION FOR OPTOELECTRONIC DEVICES

BACKGROUND

Imaging and other electronic devices often include optoelectronic components to sense or generate various types of light. Some of these components, such as light-emitting diodes, are capable of generating large amounts of light in response to application of a corresponding level of electrical current. In other words, energy output of the optoelectronic component is based in part on the electrical current applied to the component's PN junction. The light emitted from the component, however, comprises only a portion of this energy. The remaining energy is released as heat due to electrical and optical losses of the device.

Thermal resistance of optoelectronic component packaging is typically high (e.g., 70 or 80° K/W), which impedes the transfer of the heat out of the component. As such, heat generated during component operation that does not leave the packaging contributes to an increase in the component's overall temperature. For high-output optoelectronic components, this temperature increase typically occurs quickly due to the large amounts of current passing through the component. Because high temperatures effect component performance or reliability, operation of many optoelectronic components is thermally limited (e.g., reduced on-time or operating current) to maintain light-output specifications and prevent component damage.

SUMMARY

This document describes techniques and apparatuses that implement high thermal conductivity regions for optoelectronic devices. In some embodiments, a high thermal conductivity region is inserted into or formed in a cavity of printed circuit board (PCB). The high thermal conductivity region extends through the PCB, such that first and second surfaces of the high thermal conductivity region are substantially coplanar or flush with exterior layers of the PCB. An optoelectronic device (e.g., laser diode) can be mounted to the first surface of the high thermal conductivity region via thermal conductive material or adhesive. This enables heat of the optoelectronic device to be transferred away from the device and through the PCB, such as to other PCB layers or a heat sink coupled to the second surface of the high thermal conductivity region.

In some cases, the high conductivity thermal region functions as part of a circuit to control or power the optoelectronic device. In such cases, the second surface of the high thermal conductivity region can be electrically insulated via solder mask to prevent the heat sink from shorting out the optoelectronic component. Thus, the high thermal conductivity region can enable the efficient transfer of heat away from the optoelectronic device while being insulated from the heat sink or other conductive structures proximate the PCB. By so doing, large amounts of heat can be transferred from the optoelectronic device, thereby minimizing an increase in device temperature during operation. In at least some cases, this improves thermal performance of the optoelectronic device by permitting the device to operate for longer durations of time, in higher ambient temperatures, at higher duty-cycles, or with higher levels of output power.

This summary is provided to introduce simplified concepts that are further described below in the Detailed Description. This summary is not intended to identify essential features of the claimed subject matter, nor is it intended for use in determining the scope of the claimed subject matter. Techniques and/or apparatuses that implement a high thermal conductivity region are also referred to herein separately or in conjunction as the "techniques" as permitted by the context, though techniques may include or instead represent other aspects described herein.

BRIEF DESCRIPTION OF THE DRAWINGS

Embodiments of high thermal conductivity regions are described with reference to the following drawings. The same numbers are used throughout the drawings to reference like features and components.

DETAILED DESCRIPTION

Overview

This document describes techniques and apparatuses that implement high thermal conductivity regions for optoelectronic devices. These techniques and apparatuses may implement a high thermal conductivity region in a cavity of printed circuit board (PCB) that is configured to receive or form the high thermal conductivity region. An optoelectronic device, such as a laser diode or light-emitting diode, is then mounted to a first surface of the high thermal conductivity region. In some cases, the high thermal conductivity region is also electrically conductive and may form part of a circuit for controlling or powering the optoelectronic device. In such cases, a second surface of the high thermal conductivity region can be insulated to prevent an electrical short with a heat sink or other conductive structures on the other side of the PCB.

The high conductivity thermal region enables heat of the optoelectronic device to be transferred away from the device and through the circuit board, such as to other PCB layers or a heat sink. Additionally, by sizing the high conductivity thermal region to match a footprint of the optoelectronic device, design tolerances and clearances of optoelectronic driving circuitry can be reduced (e.g., tightened). In some cases, this enables the use of shorter traces or wire bonds, which reduce inductance and improve performance in high frequency device switching applications. These are but a few examples of many ways in which the techniques or apparatuses are implemented, others of which are described below.

Example Operating Environment

Figure 1:
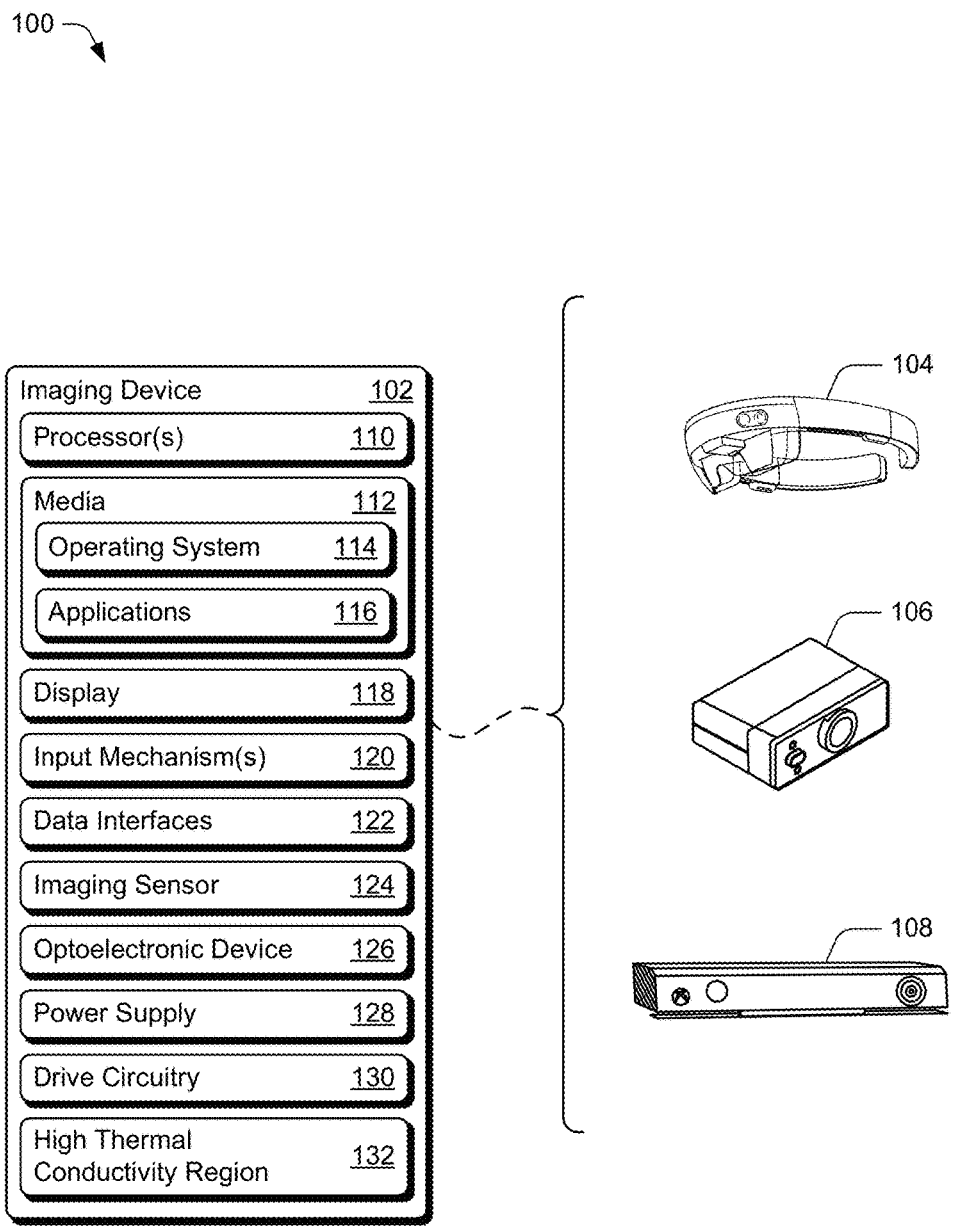
FIG. 1 illustrates an example environment that includes devices in which a high thermal conductivity region can be implemented.

FIG. 1 illustrates an example operating environment 100 in which high thermal conductivity regions can be embodied. The operating environment 100 includes an imaging device 102, which is illustrated with three examples: smart glasses 104, an optical coherence tomography (OCT) camera 106, and a time-of-flight (ToF) 3D sensor 108, though other devices and systems, such as digital cameras, optical sensors, projectors, range finders, industrial lasers, optical media drives, fiber optic equipment, laser alignment systems, optical scanners, computing devices, and laser-based printers may also be used.

The imaging device 102 includes processor(s) 110 and computer-readable storage media 112 (media 112). The media 112 includes an operating system 114 and applications 116, which enable various functions of the imaging device 102. The operating system 114 manages resources of the imaging device 102, such as the processor 110, media 112, and other hardware subsystems. The applications 116 comprise programs or code that access the resources managed by operating system 114 to implement various functions of the imaging device 102.

The imaging device 102 may also include a display 118, input mechanisms 120, and data interfaces 122. Although shown integrated with some imaging devices, such as the smart glasses 104, the display 118 can be implemented separate from the imaging device 102. The input mechanisms 120 may include gesture-sensitive sensors and devices, such as touch-based sensors and movement-tracking sensors (e.g., camera-based), buttons, touch pads, accelerometers, and microphones with accompanying voice recognition software, to name a few.

The data interfaces 122 include any suitable wired or wireless data interfaces that enable the imaging device 102 to communicate data with other devices or networks. Wired data interfaces may include serial or parallel communication interfaces, such as a universal serial bus (USB) and local-area-network (LAN). Wireless data interfaces may include transceivers or modules configured to communicate via infrastructure or peer-to-peer networks. One or more of these wireless data interfaces may be configured to communicate via near-field communication (NFC), a personal-area-network (PAN), a wireless local-area-network (WLAN), or wireless wide-area-network (WWAN).

The imaging device 102 also includes an imaging sensor 124 and an optoelectronic device 126. The imaging sensor 124 can sense or capture light, such as ambient light levels, various imagery, or color information. In some cases, the imaging sensor 124 is configured measure range or distance based on time-of-flight of light from a subject. The optoelectronic device 126 may comprise any suitable type of device, such as a light-emitting diode (LED), side-emitting LED, top-emitting LED, laser diode (side- or top-emitting), and so on.

A power supply 128 of the imaging device provides operating power to the imaging sensor 124 and optoelectronic device 126. In some cases, the power supply 128 provides operating power at multiple voltage levels, such as 1.8 volts, 3.3 volts, or 5.0 volts. Drive circuitry 130 can control or apply the operating power to the optoelectronic device 126, thereby controlling light generated by the optoelectronic device 126. In some cases, the drive circuitry 130 varies a voltage or an amount of current applied to the optoelectronic device 126 to adjust the amount of light generated.

The imaging device 102 also includes a high thermal conductivity region 132. In some aspects, the optoelectronic device 126 is thermally coupled to the high thermal conductivity region 132, which can transfer heat away from the device. Alternately or additionally, the optoelectronic device 126 can be electrically connected to the high thermal conductivity region 132, thereby enabling the optoelectronic device to the powered or controlled via the high thermal conductivity region 132. How the high thermal conductivity region 132 is implemented and used varies, and is further described herein.

Figure 2:
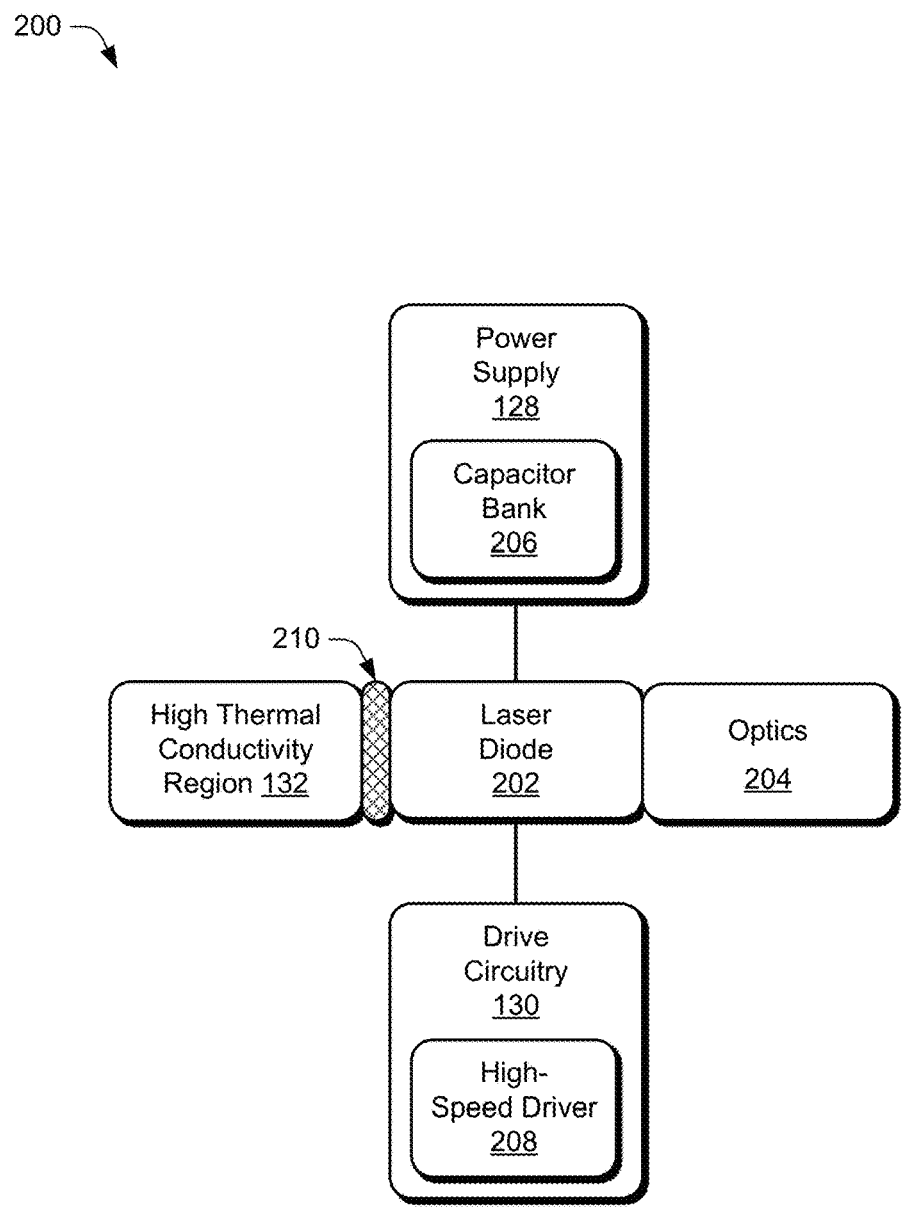
FIG. 2 illustrates an example configuration of an optoelectronic system that includes a high thermal conductivity region.

FIG. 2 illustrates an example configuration of an optoelectronic system 200 in which aspects of a high thermal conductivity region can be implemented. In this particular example, the optoelectronic system 200 includes a laser diode 202 that emits laser light into optics 204. The optics 204 may include lenses and mirrors that redirect (e.g., steer) or focus the laser light emitted by the laser diode 202.

In some cases, the laser diode 202 is a surface mount technology (SMT) side-emitting laser diode that emits laser light parallel to a PCB on which the laser diode is mounted. An example illumination pattern for this laser light is a half maximum angle of 45° across the full width of the device's emitting surface. In such cases, the optics 204 may be situated adjacent to the laser diode and through the PCB effective to enable the collection of laser light directed toward and away from the surface of the PCB at 90° (e.g., light emitted orthogonal to the PCB).

The laser diode 202 is powered by the power supply 128 and controlled by drive circuitry 130. The power supply 128 includes a capacitor bank 206 of multiple capacitors, which are configured to store energy for use by the laser diode 202. The drive circuitry 130 controls a flow of current through the laser diode 202, and thus the laser light generated by the laser diode 202. In this particular example, the drive circuitry 130 includes a high-speed driver 208, which may be implemented as a fast switching, low resistance metal-oxide-semiconductor field-effect transistor (MOSFET) switch. The high-speed driver can be implemented as a low-side switch (sinking) or high-side switch (sourcing) to control the application of current to the laser diode 202.

The optoelectronic system 200 includes a high thermal conductivity region 132 that is coupled to the laser diode via conductive material 210 (e.g., thermal conductive material). The conductive material 210 can reduce a thermal resistance between a package of the laser diode 202 and the high thermal conductivity region 132. In some cases, the conductive material 210 is also electrically conductive, which enables control or powering of the laser diode 202 through the high thermal conductivity region 132. In such cases, the conductive material 210 can be solder or another metal-based grease, paste, or adhesive.

Thermally coupling the laser diode 202 to the high thermal conductivity region 132 enables heat of the laser diode 202 to be transferred out of and away from the device. In some cases, this can be effective to reduce a thermal resistance of the laser diode 202 to approximately 5 to 10° K/W. In other words, for every Watt of power dissipated, a temperature of the laser diode increases approximately 5 to 10 degrees Kelvin. Thus, the laser diode 202 can operate at increased output levels, over long durations of time, or at higher duty-cycles without the typical increase in temperature that effects performance or reliability of optoelectronic devices with substantially higher thermal resistance.

Figure 3:
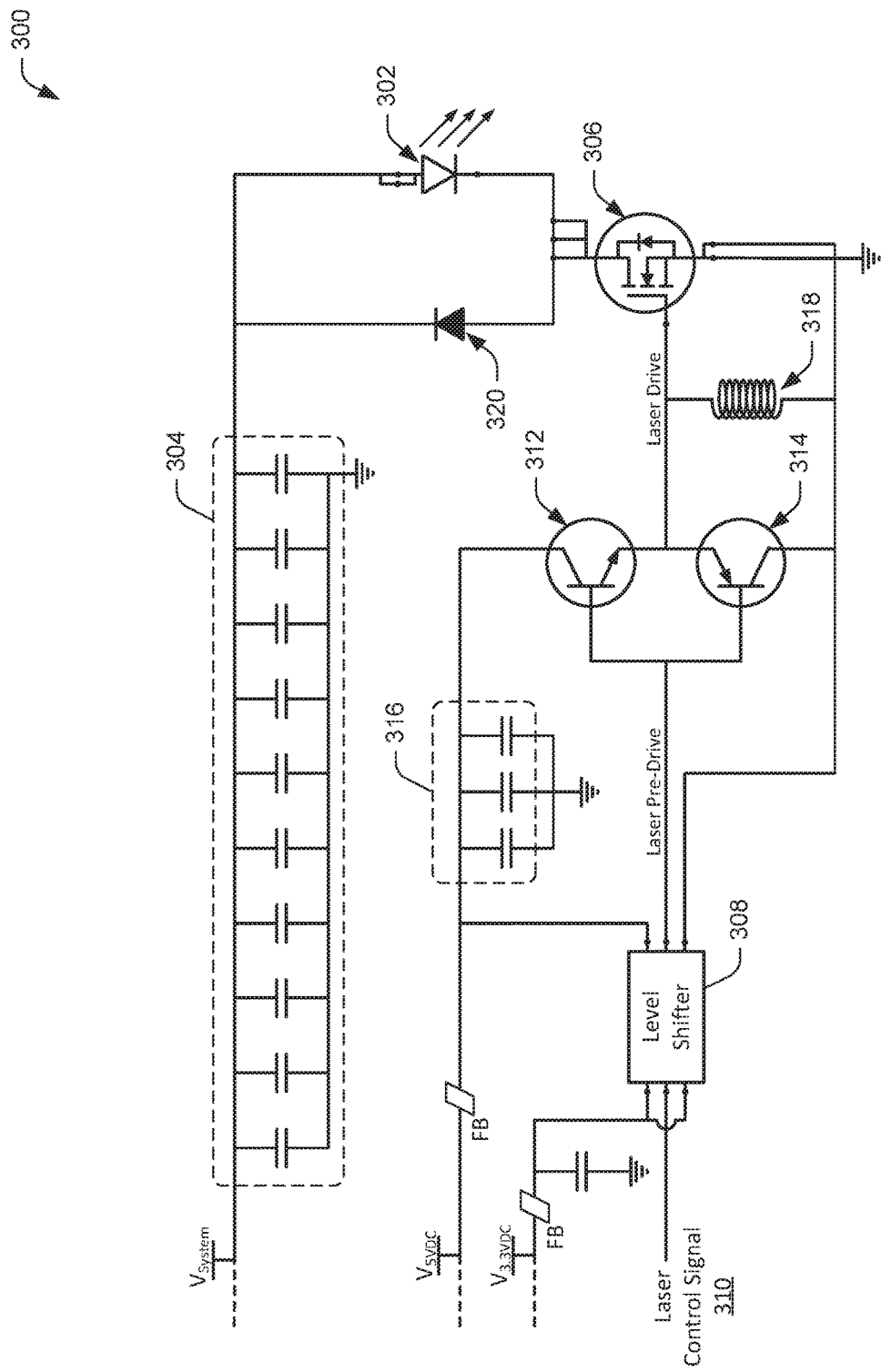
FIG. 3 illustrates an example schematic of circuits and components for powering and controlling an optoelectronic device.

FIG. 3 illustrates an example schematic of circuits and components for powering and controlling an optoelectronic device at 300. In this particular example, a laser diode 302 is coupled to a capacitor bank 304 that stores energy received from a system level power supply ($V_{System}$). The system level power supply may include higher voltage external or battery power rail of a device that is not stepped down by an internal power supply. Current flow through the laser diode 302 is controlled by a high-speed driver 306, which is implemented as an N-channel MOSFET.

To drive the high-speed driver 306, a level shifter 308 converts a laser control signal 310 from a 3.3 volt signal to a 5.0 volt signal by using respective 3.3 volt and 5 volt power rails. The shifted control signal, or laser pre-drive signal, drives a pair of bipolar junction transistors (BJTs) that include NPN transistor 312 and PNP transistor 314. The pair of BJTs draw current from another capacitor bank 316 to amplifier the laser pre-drive signal to provide a laser drive signal.

The laser drive signal is applied, based on the laser control signal 310, to the gate of the high-speed driver 306 to cause current flow through the laser diode 302. Responsive to the current flow, the laser diode 302 emits laser light, a byproduct of which is heat that spreads throughout packaging (e.g. ceramic mount or sub-mount) of the laser diode 302. In some aspects, thermally coupling the laser diode 302 to a high thermal conductivity region is effective to transfer this heat out of and away from the packaging. Here, the circuit also includes a shunt inductor to enable faster switching of the gate of the high-speed driver 306. In some cases, this ensures sufficient drive current for high-speed switching frequencies, such as those less than 10 nanoseconds. A suppression diode 320 (e.g., fly-back or catch diode) may reduce voltage spikes, current surges, or noise caused by high-speed operation of the laser diode 302 and high-speed driver 306.

Figure 4:
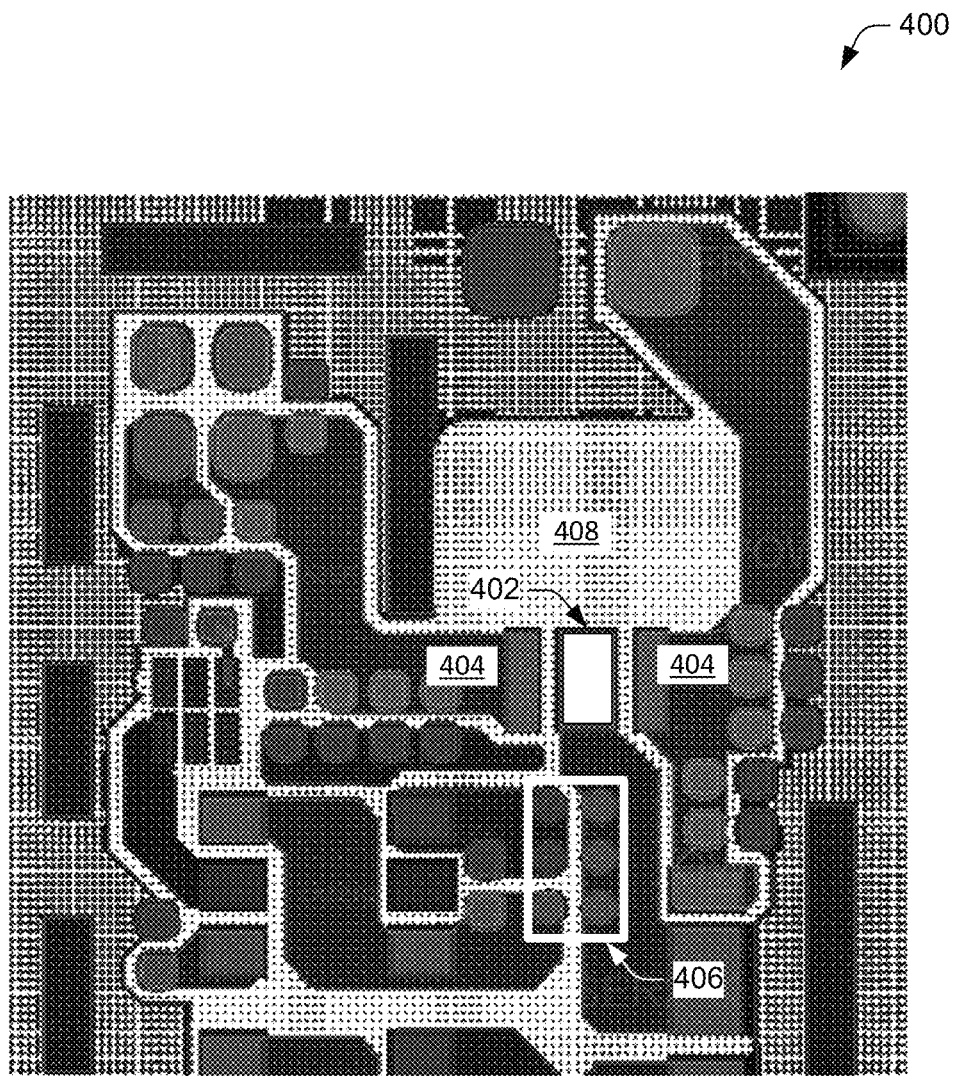
FIG. 4 illustrates an example printed circuit board layout for implementing a high thermal conductivity region and optoelectronic device.

FIG. 4 illustrates an example printed circuit board layout for implementing a high thermal conductivity region and optoelectronic device at 400. In some cases, the circuitry shown in FIG. 3 can be implemented with the example layout illustrated in FIG. 4. In this particular example, the PCB layout includes multiple layers that each support a respective set of copper traces. For visual brevity, some traces or areas of the layout are not labeled with individual net or component names.

The PCB layout includes an area in which to mount a laser diode at 402 or other electronic component, such as an LED or high-power switch. The area 402 can be suitable for implementing a high thermal conductivity region in the PCB and underneath an electrical or optoelectronic component. The layout also includes power traces 404, which provide electrical current to pads adjacent to the area 402. To electrically connect the laser diode to power, wire bonds can be attached between terminals of the diode and the pads. In some cases, length of the wire bonds is minimized (e.g., less than 500 micrometers) to reduce inductance of the power circuit (e.g., approximately 300 picohenries).

A high-speed driver located at area 406 controls current passing through the laser diode by connecting another terminal of the laser diode to ground, thereby sinking current through the laser diode. The PCB layout also includes a keep-out 408 for a cavity in which to place optics adjacent to the laser diode. Alternately or additionally, PCB layouts may include other keep-outs for heat sink mounts, standoffs, or other mechanics.

Figure 5:
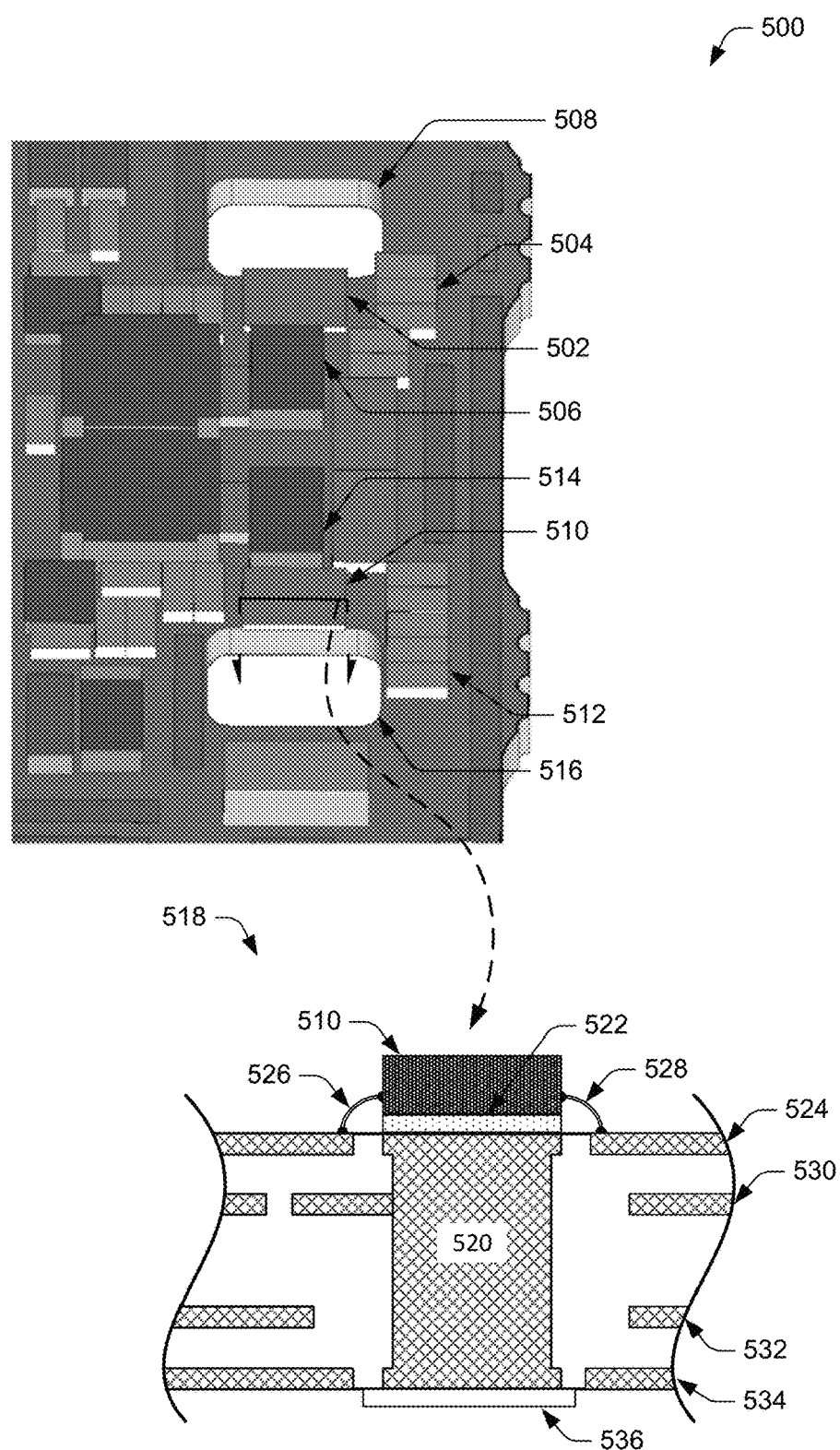
FIG. 5 illustrates an example printed circuit board assembly that includes edge-emitting optoelectronic devices and high conductivity thermal regions.

FIG. 5 illustrates an example printed circuit board assembly that includes edge-emitting optoelectronic devices and high conductivity thermal regions. This particular assembly includes components to implement two optoelectronic circuits that each include a high thermal conductivity region.

A first circuit of the assembly includes an edge-emitting laser diode 502 (laser diode 502) that is powered by a capacitor bank 504 and controlled by a high-speed driver 506. These components may be implemented similar to or differently from corresponding or like components described with reference to FIGS. 1-4. The assembly also includes an optics cavity 508 that is routed or drilled through the PCB on which the other components are mounted. The optics cavity 508 is located adjacent to a light-emitting surface of the laser diode 502. This enables an optic inserted into the optics cavity 508 to collect and steer the light emitted by the laser diode 502.

A second circuit of the assembly includes another edge-emitting laser diode 510 (laser diode 510) that is powered by a capacitor bank 512 and controlled by a high-speed driver 514. The first and second circuits may be controlled separately, and thus activate either of the laser diodes 502, 510 independently from one another. These components may be implemented similar to or differently from corresponding or like components described with reference to FIGS. 1-4. The assembly also includes an optics cavity 516 that is routed or drilled through the PCB on which the other components are mounted. As shown in FIG. 5, the optics cavity 516 is positioned adjacent to the laser diode 510 such that optics in the cavity can collect and steer light emitted not only parallel to the PCB, but also at light emitted at downward angles.

The mounting and other aspects of the laser diode 510 are shown in greater detail at cross-section 518. Here, a high thermal conductivity region 520 occupies a cavity in the PCB located below the laser diode 510. The high thermal conductivity region 520 may comprise any suitable material such as copper, copper alloy, metallic-based resin, metallic-based epoxy (e.g., copper epoxy), carbon foam, or a nano-tube composite. The laser diode 510 is mounted to the high thermal conductivity region 520 via a conductive material 522, such as solder or conductive adhesive. As such, an electrical contact of the laser diode 510 (e.g., P-side) may be electrically connected to the high thermal conductivity region 520.

In some cases, an electrical contact of the laser diode 510 (e.g., N-side) is connected to external traces 524 of the PCB via wire bonds 526 and 528. The PCB may also include internal traces 530 and 532, and other external traces 534 that are embodied on an opposite side of the PCB. Because the high thermal conductivity region 520 can be electrically connected to the laser diode 510, exterior traces of the PCB, or internal traces of the PCB, another side of the high thermal conductivity region 520 may be coated with an insulator 536. This can be effective to prevent circuitry connect to the high thermal conductivity region 520 from shorting out to external traces 534, a heat sink, or other conductive structures on the other side of the PCB.

With respect to geometry of a laser diode, an associated high thermal conductivity region, and cavity thereof, can be sized to occupy an approximately matched area below the laser diode. For example, laser diode width may range from 0.4-5.0 mm and laser diode length may range from 0.5 mm-4 mm. A corresponding high thermal conductivity region may exceed this geometry from 0.0-1.0 mm per side, such that geometry of the region is approximately with 500 micrometers of that of the laser diode. In some cases, the geometry of the high thermal conductivity region may not exceed 50 micrometers per side of the laser diodes footprint.

As shown in FIG. 5, keeping these respective geometries close may enable the use of shorter wire bonds to connect the laser diode to external traces of the PCB. By so doing, parasitic inductance of the electrical connection can be reduced to approximately 300 picohenries, which may be beneficial for high frequency operation (e.g., greater than 100 MHz or less than 10 nanoseconds) of the laser diode.

Although described with respect to optoelectronic devices, a high thermal conductivity region can be implemented for any suitable type of electronic device. In particular, high thermal conductivity regions may be implemented in with any high power, high current, or fast switching electronic component or device. For example, a high thermal conductivity region can be implemented in conjunction with a high-speed switching MOSFET in order to dissipate or transfer heat away from packaging of the MOSFET.

Alternately or additionally, multiple high thermal conductivity regions may be implemented as a thermal solution for larger components of a PCB, such as processors or memory arrays. As such, high thermal conductivity regions can be implemented in any computing or electronic device in which other types of electronic devices are mounted to PCBs.

Example Methods

The methods described herein may be used separately or in combination with each other, in whole or in part. These methods are shown as sets of operations (or acts) performed, such as through one or more entities or modules, and are not necessarily limited to the order shown for performing the operation. For example, the techniques may implement a high thermal conductivity region by drilling or routing a cavity in a printed circuit board and electroplating the cavity with high thermal conductivity material to form the region. Alternately, the techniques may stamp or glue a pre-formed high thermal conductivity region into a cavity of the printed circuit board. These are but a few examples of implementing high thermal conductivity regions using the techniques described herein. In portions of the following discussion, reference may be made to the operating environment 100 of FIG. 1, the components or assemblies of FIGS. 2-5, and other methods and example embodiments described elsewhere herein, reference to which is made for example only.

Figure 6:
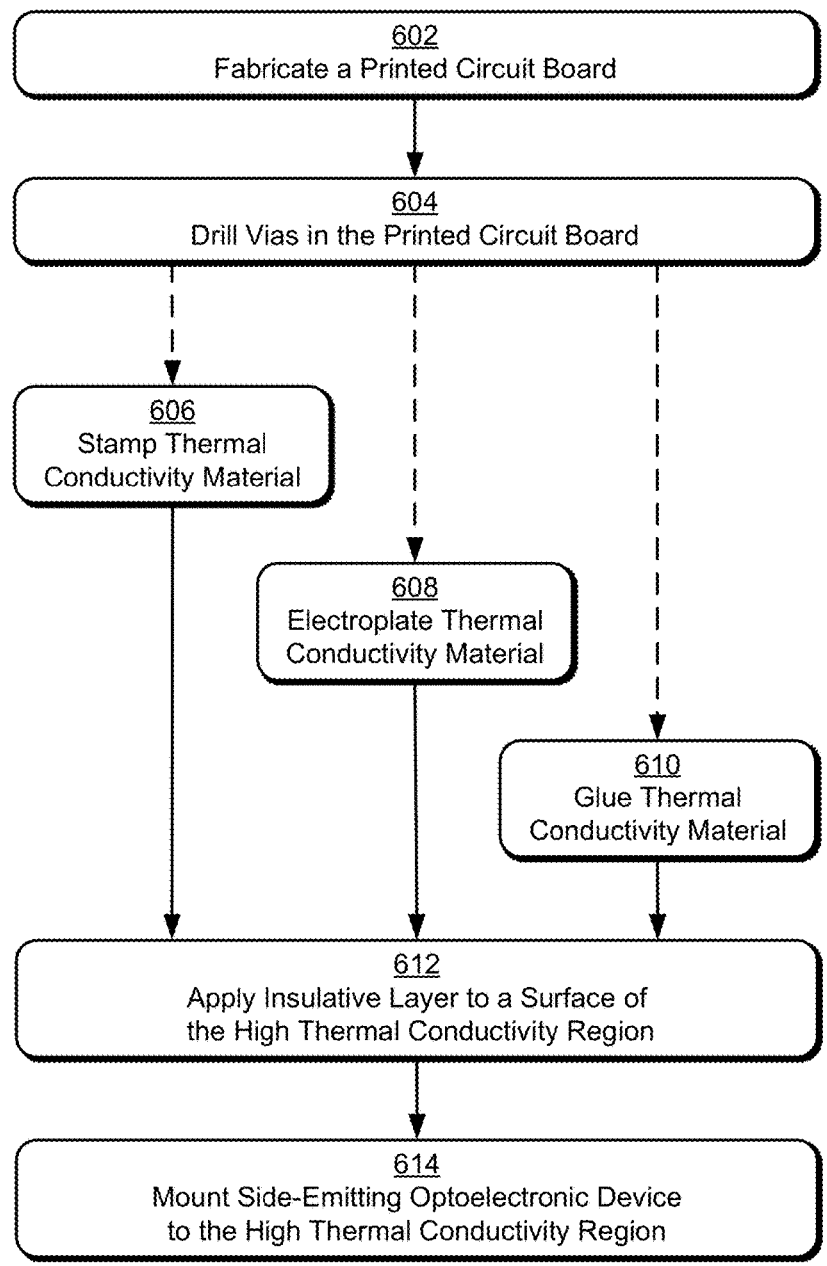
FIG. 6 illustrates an example method for manufacturing a printed circuit board that includes a high conductivity thermal region.

FIG. 6 depicts a method 600 for manufacturing a printed circuit board that includes a high conductivity thermal region in accordance with one or more embodiments. The high conductivity thermal region may be implemented similar to or differently from the high thermal conductivity region 132 as described with reference to FIGS. 1-5.

At 602, a printed circuit board is fabricated. The PCB may include any suitable type of PCB, such as a multilayer PCB having one or more internal layers of conductors. In some cases, copper is rolled onto epoxy-impregnated fiberglass material and then etched to form circuitry of the internal or external layers of the PCB. The multiple layers of the PCB can then be pinned and pressed together to form a PCB panel suitable for subsequent assembly operations. The layers of the PCB include an external layer on which conductive traces and pads etched or plated and another external layer opposite of the first. The other external layer may also include conductive traces and pads that are etched or plated with copper.

At 604, vias are drilled in the printed circuit board. The vias may be drilled as through hole that extend through the PCB, partial vias that extend from an exterior layer to an interior layer of the PCB, or blind vias between internal layers of the PCB. The drilling operation also comprises drilling or routing a cavity into the PCB that is configured to receive a high thermal conductivity region. This cavity or void extends through the PCB from one exterior layer to the other exterior layer on the opposite side of the PCB. Alternately or additionally, the cavity may be plated to connect conductors of various layers of the PCB.

From operation 604, the method 600 proceeds to an operation in which the cavity is filled with high thermal conductivity material. Accordingly, the method 600 can proceed to operation 606, operation 608, or operation 610. Although shown as separate operations, the method may implement one or more of these operations to fill the cavity of the PCB with the high thermal conductivity material.

At 606, high thermal conductivity material is stamped into the cavity of the PCB. The high thermal conductivity material stamped into the cavity may be pre-formed into a high thermal conductivity region. In some cases, the pre-formed high thermal conductivity region is an extruded cylinder or rectangular prism having a height that is approximately a thickness of the PCB. Alternately or additionally, the pre-formed high thermal conductivity region can be stamped into the cavity with a conductive adhesive or paste.

At 608, the cavity of the PCB is electroplated with high conductivity material to form the high thermal conductivity region. The electroplating is performed until the high thermal conductivity region fills the cavity. For example, the cavity can be electroplated with copper until the cavity is filled to provide a high thermal conductivity region having surfaces that are substantially coplanar or flush with the exterior layers of the PCB.

The electroplating material may be any suitable type of material, such as copper, tin, silver, and the like. In some cases, the cavity of the PCB is prepared for electroplating by applying a series of chemicals to condition, clean, or activate the surface of the cavity. Alternately or additionally, the cavity may be plated with electro-less copper or another conductive material prior to the electroplating operation. Further, the electroplated high thermal conductivity region may be ground or polished to provide a surface to which electronic devices, solder resist, solder mask, or silk screen can be applied.

At 610, high thermal conductivity material is glued into the cavity of the PCB as a pre-formed high thermal conductivity region. The high thermal conductivity material glued into the cavity may be pre-formed into a high thermal conductivity region. In some cases, the pre-formed high thermal conductivity region is an extruded cylinder or rectangular prism having a height that is approximately a thickness of the PCB. Alternately or additionally, the pre-formed high thermal conductivity region can be glued into the cavity with a conductive adhesive or paste to enable electrical connection with conductive layers of the PCB.

At 612, an insulative layer is applied to a surface of the high thermal conductivity region. The insulative layer may also be applied to areas of the PCB's exterior layer surrounding the surface of the high thermal conductivity region. The insulative layer may comprise any suitable material, such as solder resist, solder mask, silk screen, polyimide, lacquer, polymer, and the like. This insulative layer can be effective to electrically isolate the high thermal conductivity region, and circuitry connected thereto, from a heat sink or other conductive structures mounted on or proximate the exterior layer of the PCB.

At 614, a side-emitting optoelectronic device is mounted to another surface of the high conductivity thermal region. The side-emitting optoelectronic device may include a laser diode or side-emitting LED. In some cases, the side-emitting optoelectronic device is mounted or affixed with a thermally or electrically conductive adhesive. In other cases, the side-emitting optoelectronic device is soldered to the surface of the high conductivity thermal region. In such cases, the high conductivity thermal region may function as part of a circuit to control or power the side-emitting optoelectronic device.

Figure 7:
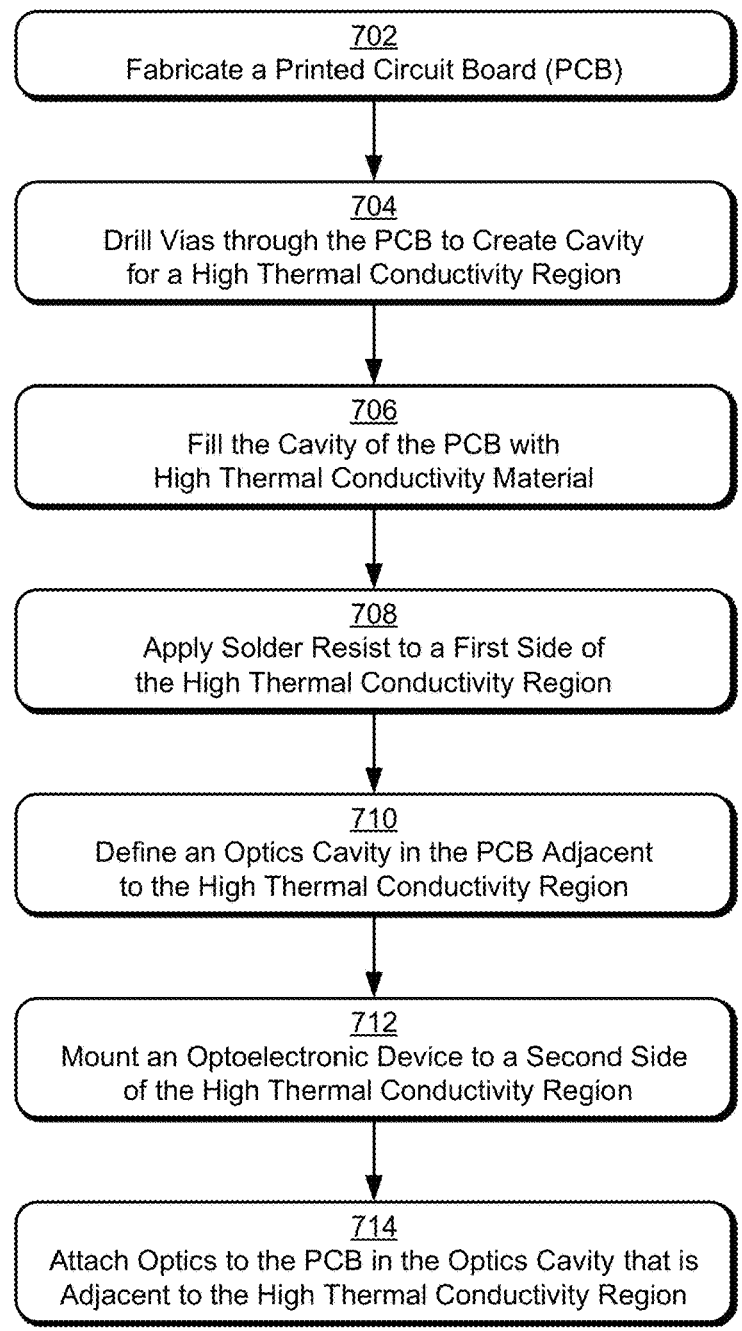
FIG. 7 illustrates an example method for assembling a printed circuit board assembly with a high thermal conductivity region and optics.

FIG. 7 depicts a method 700 assembling a printed circuit board assembly with a high thermal conductivity region and optics in accordance with one or more embodiments. The high thermal conductivity region may be implemented similar to or differently from the high thermal conductivity region 132 as described with reference to FIGS. 1-5.

At 702, a printed circuit board is fabricated. The PCB may include any suitable type of PCB, such as a multilayer PCB having one or more internal layers of conductors. In some cases, copper is rolled onto epoxy-impregnated fiberglass material and then etched to form circuitry of the internal or external layers of the PCB. The multiple layers of the PCB can then be pinned and pressed together to form a PCB panel suitable for subsequent assembly operations. The layers of the PCB include an external layer on which conductive traces and pads etched or plated and another external layer opposite of the first. The other external layer may also include conductive traces and pads that are etched or plated with copper.

At 704, vias are drilled in the printed circuit board to create a cavity for a high thermal conductivity region. The vias may be drilled as through hole that extend through the PCB, partial vias that extend from an exterior layer to an interior layer of the PCB, or blind vias between internal layers of the PCB. The drilling operation may also comprises routing the PCB to create the cavity to receive the high thermal conductivity region. The cavity may be rectangular with filleted or chamfered edges and extend through the PCB from one exterior layer to the other exterior layer on the opposite side of the PCB.

At 706, the cavity of the PCB is filled with high thermal conductivity material to form the high thermal conductivity region. The high thermal conductivity material may comprise any suitable type of material, such as copper, copper alloy, metallic-based resin, metallic-based epoxy, carbon foam, nanotube composite, and the like. In some cases, a surface of the high thermal conductivity region is polished or ground to provide a surface suitable for mounting an electronic components or heat sink. Alternately or additionally, a pre-formed high thermal conductivity region may be pressed or glued into the cavity.

At 708, solder resist is applied to a first side of the high thermal conductivity region. Solder resist or another insulative coating may be applied to a surface of the high thermal conductivity region and surrounding areas of the exterior layer of the PCB. This insulative layer can be effective to electrically isolate the high thermal conductivity region, and circuitry connected thereto, from a heat sink or other conductive structures mounted on or proximate the exterior layer of the PCB.

At 710, an optics cavity is defined in the PCB adjacent to the high thermal conductivity region. The optics cavity may be formed to support a lens or mirror assembly adjacent to a light-emitting surface of an optoelectronic component mounted to the high thermal conductivity region. Alternately, for top-emitting optoelectronic devices, the optics cavity may include multiple cavities configured to support stand-offs for optics that mount above a device attached to the high thermal conductivity region.

At 712, an optoelectronic device is mounted to a second side of the high thermal conductivity region. The optoelectronic device may include any suitable device, such as a laser diode, side-emitting LED, top-emitting LED, and the like. In some cases, the optoelectronic device is mounted or affixed with a thermally or electrically conductive adhesive. In other cases, the optoelectronic device is soldered to the surface of the high conductivity thermal region. In such cases, the high conductivity thermal region may function as part of a circuit to control or power the optoelectronic device At 714, optics are attached to the PCB in the optics cavity that is adjacent to the high thermal conductivity region. The optics may include any suitable type of optical device or assembly, such as a light guide, lens, mirror, filter, polarizer, diffuser, or prism. The optics can be positioned adjacent or above the optoelectronic device such that a light-receiving surface of the optics face a light-emitting surface of the optoelectronic device. For side-emitting optoelectronic device, this can enable the optics to collect light emitted parallel to and toward an exterior layer of the PCB.

Aspects of these methods may be implemented in hardware (e.g., fixed logic circuitry), firmware, a System-on-Chip (SoC), software, manual processing, or any combination thereof. A software implementation represents program code that performs specified tasks when executed by a computer processor, such as software, applications, routines, programs, objects, components, data structures, procedures, modules, functions, and the like. The program code can be stored in one or more computer-readable memory devices, both local and/or remote to a computer processor. The methods may also be practiced in a distributed computing environment by multiple computing devices.

Example Device

Figure 8:
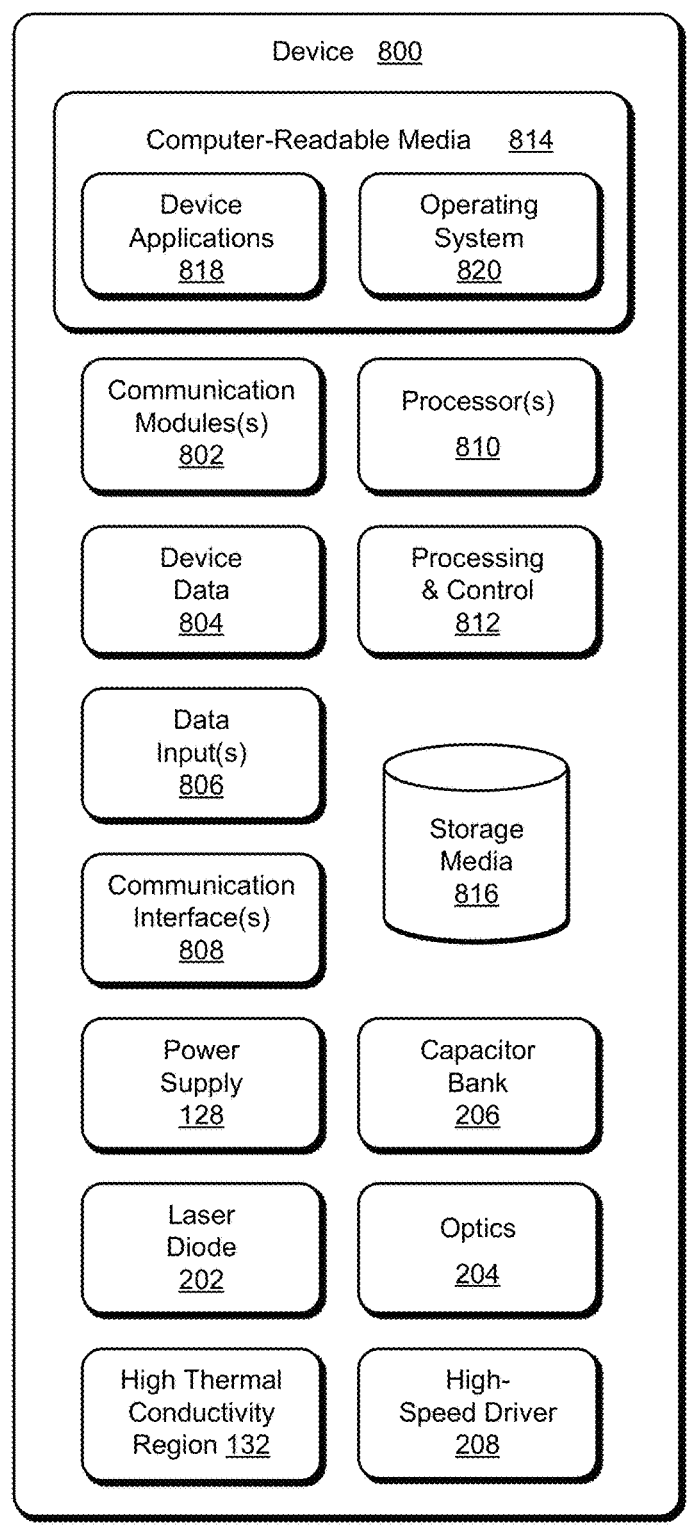
FIG. 8 illustrates an example device in which a high conductivity thermal region can be implemented.

FIG. 8 illustrates various components of an example device 800 that can be implemented as any type of mobile, electronic, imaging, and/or computing device as described with reference to the previous FIGS. 1-5 to implement a high thermal conductivity region. In embodiments, the device 800 can be implemented as one or a combination of a wired and/or wireless device, as a form of imaging device, depth sensor, gesture sensor, television client device (e.g., television set-top box, digital video recorder (DVR), etc.), consumer device, computer device, server device, portable computer device, user device, communication device, video processing and/or rendering device, appliance device, gaming device, electronic device, and/or as another type of device. The device 800 may also be associated with a user (e.g., a person) and/or an entity that operates the device such that a device describes logical devices that include users, software, firmware, and/or a combination thereof.

The device 800 includes communication modules 802 that enable wired and/or wireless communication of device data 804 (e.g., received data, data that is being received, data scheduled for broadcast, data packets of the data, etc.). The device data 804 or other device content can include configuration settings of the device, media content stored on the device, and/or information associated with a user of the device. The media content stored on the device 800 may include any type of audio, video, graphical, depth, and/or image data. The device 800 includes one or more data inputs 806 via which any type of data, media content, and/or inputs can be received, such as user-selectable inputs, messages, music, television media content, recorded video content, and any other type of audio, video, and/or image data received from any content and/or data source.

The device 800 also includes communication interfaces 808, which can be implemented as any one or more of a serial and/or parallel interface, a wireless interface, any type of network interface, a modem, and as any other type of communication interface. The communication interfaces 808 provide a connection and/or communication links between the device 800 and a communication network by which other electronic, computing, and communication devices communicate data with the device 800.

The device 800 includes one or more processors 810 (e.g., application processors, microprocessors, microcontrollers, digital-signal processors, and the like), which process various computer-executable instructions to control operations of the device 800. Alternatively or in addition, the device 800 can be implemented with any one or combination of hardware, firmware, or fixed logic circuitry that is implemented in connection with processing and control circuits which are generally identified at 812. Although not shown, the device 800 can include a system bus or data transfer system that couples the various components within the device. A system bus can include any one or combination of different bus structures, such as a memory bus or memory controller, a peripheral bus, a universal serial bus, and/or a processor or local bus that utilizes any of a variety of bus architectures.

The device 800 also includes computer-readable storage media 814, such as one or more memory devices that enable persistent and/or non-transitory data storage (i.e., in contrast to mere signal transmission), examples of which include random access memory (RAM), non-volatile memory, read-only memory (ROM), or flash memory. The device 800 can also include a mass storage media device 816, such as a hard disk drive, solid-state drive, a recordable and/or rewriteable compact disc (CD), any type of a digital versatile disc (DVD), and the like.

The computer-readable storage media 814 and/or mass storage media 816 provide data storage mechanisms to store the device data 804, as well as various device applications 818 and any other types of information and/or data related to operational aspects of the device 800. For example, an operating system 820 can be maintained as processor-executable code within the computer-readable storage media 814 and executed by the processors 810. The device applications 818 may include a device manager, such as any form of a control application, software application, signal-processing and control module, code that is native to a particular device, a hardware abstraction layer for a particular device, and so on.

This example device 800 also includes a laser diode 202 and optics 204 to generate and direct laser light, respectively. A power supply 128 and capacitor bank 206 of the device 800 provide operating power for the laser diode 202 and other optoelectronic circuits of the device 800. Operation (e.g., on-time or duty-cycle) of the laser diode 202 is controlled or modulated by high-speed driver 208. The device 800 includes a high thermal conductivity region 132 that is thermally coupled to the laser diode 202 to transfer heat out of or away from the diode. These components, such as the laser diode 202, optics, high-speed driver 208, and high thermal conductivity region 132, may be implemented similar to or differently from the respective components described with reference to FIGS. 1-7.

CONCLUSION

Although embodiments of techniques and apparatuses that implement high thermal conductivity regions have been described in language specific to features and/or methods, it is to be understood that the subject of the appended claims is not necessarily limited to the specific features or methods described. Rather, the specific features and methods are disclosed as example implementations of high thermal conductivity regions.

What is claimed is:

1. A printed circuit board assembly comprising:
   a printed circuit board (PCB) having a first exterior layer on which conductive traces are embodied and a second exterior layer opposite to the first exterior layer;
   a high thermal conductivity region that extends through the PCB, the high thermal conductivity region having a first surface that is substantially flush to the first exterior layer of the PCB and a second surface that is substantially flush to the second exterior layer of the PCB; and
   a side-emitting or top-emitting optoelectronic device having a first electrical contact connected to the first surface of the high thermal conductivity region, that is substantially flush to the first exterior layer of the PCB, via electrically conductive material and a second electrical contact connected to the conductive traces of the first exterior layer of the PCB via wire bonds.

2. The printed circuit board assembly of claim 1, further comprising an insulative layer of material on the second surface of the high thermal conductivity region and at least a portion of the second exterior surface of the PCB.

3. The printed circuit board assembly of claim 1, wherein planar dimensions of the first surface of the high thermal conductivity region exceed planar dimensions of the first electrical contact of the side-emitting or top-emitting optoelectronic device by less than 50 micrometers.

4. The printed circuit board assembly of claim 1, further comprising a cavity that extends through the PCB and located adjacent to the high thermal conductivity region.

5. The printed circuit board assembly of claim 4, further comprising an optical component that occupies at least a portion of the cavity and protrudes above the first exterior layer of the PCB.

6. The printed circuit board assembly of claim 5, wherein a portion of the optical component that protrudes above the first exterior layer of the PCB comprises a light-receiving surface that is oriented toward a light-emitting surface of the side-emitting or top-emitting optoelectronic device.

7. The printed circuit board assembly of claim 5, wherein the side-emitting or top-emitting optoelectronic component comprises a light-emitting diode (LED) or laser diode, and the optical component comprises one of a light guide, lens, mirror, filter, polarizer, diffuser, or prism.

8. The printed circuit board assembly of claim 1, wherein the high thermal conductivity region comprises copper, copper alloy, metallic-based resin, metallic-based epoxy, carbon foam, or a nanotube composite.

9. The printed circuit board assembly of claim 1, wherein the side-emitting or top-emitting optoelectronic device is positioned above the first surface of the high thermal conductivity region.

10. An apparatus comprising:
    a multilayer printed circuit board (PCB) having a first exterior layer on which conductive traces are embodied and a second exterior layer opposite to the first exterior layer;
    a high thermal conductivity region that extends through the multilayer PCB, the high thermal conductivity region having a first surface that is substantially flush with the first exterior layer of the multilayer PCB and a second surface that is substantially flush with the second exterior layer of the multilayer PCB;

a side-emitting or top-emitting optoelectronic device having a first electrical contact connected to the first surface of the high thermal conductivity region, that is substantially flush with the first exterior layer of the multilayer PCB, via electrically conductive material and a second electrical contact connected to the conductive traces of the first exterior layer of the multilayer PCB via wire bonds;

a cavity adjacent to the high thermal conductivity region that extends through the multilayer PCB; and an optical component occupying at least a portion of the cavity and extending above the first exterior layer of the multilayer PCB such that a light-receiving surface of the optical component is oriented toward the side-emitting or top-emitting optoelectronic device diode.

11. The apparatus of claim 10, further comprising an insulative layer of material on the second surface of the high thermal conductivity region and at least a portion of the second exterior surface of the multilayer PCB.

12. The apparatus of claim 10, wherein planar dimensions of the first surface of the high thermal conductivity region exceed planar dimensions of the first electrical contact of the side-emitting or top-emitting optoelectronic device by less than 50 micrometers.

13. The apparatus of claim 10, wherein planar dimensions of the first surface of the high thermal conductivity region exceed planar dimensions of the first electrical contact of the side-emitting or top-emitting optoelectronic device by less than 500 micrometers.

14. The apparatus of claim 10, wherein the multilayer PCB further comprises multiple internal layers on which respective conductive traces are embodied and the high thermal conductivity regions is electrically connected to the respective conductive traces of at least two of the multiple internal layers.

15. The apparatus of claim 10, wherein the side-emitting or top-emitting optoelectronic component comprises a light-emitting diode (LED) or laser diode, and the optical component comprises one of a light guide, lens, mirror, filter, polarizer, diffuser, or prism.

16. The apparatus of claim 10, wherein the high thermal conductivity region comprises copper, copper alloy, metallic-based resin, metallic-based epoxy, carbon foam, or a nanotube composite.

17. The apparatus of claim 10, wherein the side-emitting or top-emitting optoelectronic device is positioned above the first surface of the high thermal conductivity region.

\* \* \* \* \*